United States Patent
Wu et al.

(10) Patent No.: US 9,964,468 B1
(45) Date of Patent: May 8, 2018

(54) OPTIMIZING SENSOR PLACEMENT FOR STRUCTURAL HEALTH MONITORING

(71) Applicant: Bentley Systems, Incorporated, Exton, PA (US)

(72) Inventors: Zheng Yi Wu, Watertown, CT (US); Xiaohua Yi, Houston, TX (US)

(73) Assignee: Bentley Systems, Incorporated, Exton, PA (US)

( * ) Notice: Subject to any disclaimer, the term of this patent is extended or adjusted under 35 U.S.C. 154(b) by 412 days.

(21) Appl. No.: 14/563,668

(22) Filed: Dec. 8, 2014

(51) Int. Cl.
  *G01R 21/133* (2006.01)
  *G01M 99/00* (2011.01)

(52) U.S. Cl.
  CPC ........... *G01M 99/00* (2013.01); *G01R 21/133* (2013.01)

(58) Field of Classification Search
  CPC .... G01M 99/00; G01M 99/005; G01R 21/133
  USPC ............................................ 702/85, 182, 61
  See application file for complete search history.

(56) References Cited

U.S. PATENT DOCUMENTS

| | | | |
|---|---|---|---|
| 6,006,604 A * | 12/1999 | Rabelo | G01F 23/0069 73/290 R |
| 7,574,338 B1 | 8/2009 | Kaul | |
| 8,265,911 B1 | 9/2012 | Wu et al. | |
| 8,301,400 B2 | 10/2012 | Beard et al. | |
| 8,458,715 B1 * | 6/2013 | Khosla | G06Q 10/06 702/104 |
| 9,014,415 B2 * | 4/2015 | Chen | G06T 7/0002 382/100 |
| 9,354,043 B2 * | 5/2016 | Parker | E04B 1/00 |
| 2002/0046144 A1 * | 4/2002 | Graff | G06Q 30/06 705/36 R |
| 2005/0072234 A1 * | 4/2005 | Zhu | G01H 1/00 73/579 |
| 2008/0178663 A1 | 7/2008 | Yang | |
| 2008/0255777 A1 * | 10/2008 | Beard | G01N 29/041 702/35 |
| 2009/0326834 A1 | 12/2009 | Sundaresan et al. | |
| 2011/0046929 A1 * | 2/2011 | Bryant | G01M 5/0066 703/2 |
| 2012/0123981 A1 * | 5/2012 | Graves | G06F 17/30339 706/13 |
| 2013/0018525 A1 * | 1/2013 | Jang | G01N 29/225 701/2 |
| 2013/0220902 A1 | 8/2013 | Lee | |

(Continued)

OTHER PUBLICATIONS

Robert F. Guratzsch and Sankaran Mahadevan ["Structural Health Monitoring Sensor Placement Optimization Under Uncertainty", AIAA Journal, vol. 48, No. 7 (2010), pp. 1281-1289].*

(Continued)

*Primary Examiner* — Michael Tran
(74) *Attorney, Agent, or Firm* — Cesari and McKenna, LLP; James A. Blanchette

(57) ABSTRACT

In one example embodiment, an analysis application is used to optimize sensor placement by implementing a two-part optimization solution procedure, involving generating a contribution database, and determining an optimized sensor location set using the contribution database. The optimized sensor location set may indicate locations that maximize coverage of dynamic integrity, which is quantified by as a ratio of detectable damage scenarios to all damage scenarios used by the analysis application.

17 Claims, 13 Drawing Sheets

(56) References Cited

U.S. PATENT DOCUMENTS

| | | | |
|---|---|---|---|
| 2013/0262068 A1 | 10/2013 | Israeli | |
| 2013/0327148 A1* | 12/2013 | Yan | G01N 29/34 73/628 |
| 2014/0058709 A1* | 2/2014 | Machado Viana | G01M 5/0033 703/2 |
| 2014/0163916 A1 | 6/2014 | Ba | |
| 2015/0088372 A1* | 3/2015 | Nower | G01M 7/00 701/34.4 |

OTHER PUBLICATIONS

Cobb, Richard G, & Liebst, Brad S., "Sensor Placement and Structural Damage Identification From Minimal Sensor Information," *AIAA Journal*, Feb. 1997, 35(2), pp. 369-374.

Gawronski, W., "Actuator and Sensor Placement for Structural Testing and Control," Academic Press Limited, *Journal of Sound and Vibration*, Jul. 1997, 208(1), pp. 101-109.

Glaser, S. D., Li, H., Wang, M. L., Ou, L, & Lynch, J. P., "Sensor Technology Innovation for the Advancement of Structural Health Monitoring: A Strategic Program of US-China Research for the Next Decade," *Smart Structures and Systems*, Jan. 2007, 3(2), pp. 221-244.

Hamdan, A.M.A., & Nayfeh, A.H., "Measures of Modal Controllability and Observability for First-and Second-Order Linear Systems," *Journal of Guidance, Control, and Dynamics*, May-Jun. 1989, 12(3), pp. 421-428.

Kammer, Daniel C., "Sensor Placement for On-Orbit Modal identification and Correlation of Large Space Structures," *Journal of Guidance, Control, and Dynamics*, Mar.-Apr. 1991, 14(2), pp. 251-259.

Kammer, Daniel C., "Sensor Set Expansion for Modal Vibration Testing," *Mechanical Systems and Signal Processing*, Jul. 2005, 19(4), pp. 700-713.

Kirkegaard, Poul Henning, & Brincker, Rune, "On the Optimal Location of Sensors for Parametric Identification of Linear Structural Systems," Academic Press Limited, *Mechanical Systems and Signal Processing*, Nov. 1994, 8(6), pp. 639-647.

Mackiewicz, Andrzej, Holnlcki-Szulc, Jan, & Lopez-Almansa, Francisco, "Optimal Sensor Location in Active Control of Flexible Structures," *AIAA Journal*, Mar. 1996, 34(4), pp. 857-859.

Mahfoud, Samir W, & Goldberg, David E., "Parallel Recombinative Simulated Annealing: A Genetic Algorithm," *Parallel Computing*, Jan. 1995, 21(1), pp. 1-28.

Papadimitriou, Costas, & Lombaert, Geert, "The Effect of Prediction Error Correlation on Optimal Sensor Placement in Structural Dynamics," Elsevier Ltd, *Mechanical Systems and Signal Processing*, 2012, vol. 28, pp. 105-127.

Shi, Z. Y., et al., "Optimum Sensor Placement for Structural Damage Detection," Journal of Engineering Mechanics, Nov. 2000, 126(11), pp. 1173-1179.

Shih, Y-T, Lee, AC, & Chen, J-H, "Sensor and Actuator Placement for Modal Identification," Academic Press, *Mechanical Systems and Signal Processing*, Mar. 1998, 12(5), pp. 641-659.

Udwadia, Firdaus E., "Methodology for Optimum Sensor Locations for Parameter Identification in Dynamic Systems," ASCE, *Journal of Engineering Mechanics*, Feb. 1994, 120(2), pp. 368-390.

Basseville, Michele et al. "Optimal Sensor Location for Detecting Changes in Dynamical Behavior", IEEE Transactions on Automatic Control, vol. AC-32, No. 12, Dec. 1987, 9 pages.

"Darwin Optimization User Manual", Bentley Systems, Incorporated, Sep. 2012, 40 pages.

Papadimitriou, Costas et al., "Entropy-based Optimal Sensor Location for Structural Model Updating", Journal of Vibration and Control, vol. 6, Dec. 17. 1999, 20 pages.

Papadimitriou, C., "Optimal Sensor Placement Methodology for Parametric Identification of Structural Systems", Journal of Sound and Vibration 278 (2004), 923-947, Oct. 21, 2003.

Spanache, Stefan et al., "Sensor Placement Optimisation Using Genetic Algorithms", In 15th International Workshop on Principles of Diagnosis (DX'04), pp. 179-184, Jun. 23, 2004.

"STAAD.Pro Technical Reference Manual", Bentley Systems Incorporated, Nov. 19, 2012, 775 pages.

Worden, K. et al., "Optimal Sensor Placement for Fault Detection", Engineering Structures 23 (2001), Nov. 16, 2000, pp. 885-901.

Wu, Zheng Yi, "Optimizing Pressure Logger Placement for Leakage Detection and Model Calibration", 14th Water Distribution Systems Analysis Conference, Sep. 24, 2012, 13 pages.

Yao, Leehter et al., "Sensor Placement for On-Orbit Modal Identification via a Genetic Algorithm", AIAA Journal, vol. 31, No. 10, Oct. 1993, 7 pages.

Yi, Ting-Hua et al., "Methodology Developments in Sensor Placement for Health Monitoring of Civil Infrastructures", Hindawi Publishing Corporation, International Journal of Distributed Sensor Networks, vol. 2012, Article ID 612726, Aug. 7, 2012, 12 pages.

Yi, Ting-Hua et al., "Optimal Sensor Placement for Health Monitoring if High-Rise Structure Based on Genetic Algorithm", Hindawi Publishing Corporation, Mathematical Problems in Engineering, vol. 11, Article ID 395101, Mar. 2, 2011, 13 pages.

Preis, Ami, et al., "Multi-objective Sensor Network Placement Model for Integrated Monitoring of Hydraulic and Water Quality Parameters," World City Water Forum, WCWF, Aug. 18, 2009, pp. 1-10.

Wu, Zhen Yi, et al. "Multi Objective Optimization of Sensor Placement in Water Distribution Systems," 2006 Annual Symposium on Water Distribution Systems Analysis, Cincinnati, Ohio, U.S.A., Aug. 27, 2006, pp. 1-11.

Wu, Zhen Yi, "Optimal Calibration Method for Water Distribution Water Quality Model," Taylor & Francis Group, LLC, Journal of Environmental Science and Health Part A, 41:1-16, Apr. 18, 2006, pp. 1-17.

Berry, J., Fleischer, L., Hart, W. E., Phillips, C. A. and Watson, J.-P., "Sensor placement in municipal water networks" ASCE Journal of Water Planning and Resources Management, 131:237-243, Jan. 2005, pp. 1-10.

Grayman, W., Speight, V., and Uber, J., "Using Monte-Carlo Simulation to Evaluate Alternative Water Quality Sampling Plans." Water Distribution Systems Analysis Symposium, Aug. 2006, pp. 1-11.

Isovitsch, S. L., VanBriesen, J. M., "Sensor Placement and Optimization Criteria Dependencies in a Water Distribution System," J. Water Resour. Plann. Manage. vol. 134(2), Mar. 2008, pp. 186-196.

Janke, R., "Threat Ensemble Vulnerability Assessment Sensor Placement Optimization Tool (TEVA-SPOT) Graphical User Interface User's Manual," U.S. EPA National Homeland Security Research Center (NHSRC), Sep. 2012, pp. 1-109.

Krause, A., Leskovec, J., Isovitsch, S., Xu, J., Guestrin, c., VanBriesen, J., Small, M., Fischbeck, P., "Optimizing Sensor Placements in Water Distribution Systems Using Submodular Function Maximization" 8th Annual Water Distribution Systems Analysis Symposium, Cincinnati, Ohio, USA Aug. 27-30, 2006, pp. 1-17.

Shen, R. and McBean, E., "Pareto Optimality for Sensor Placements in a Water Distribution System." J. Water Resour. Plann. Manage. 137(3), May 2011, pp. 243-248.

Speight, V., Kalsbeek, W., and DiGiano, F., "Randomized Stratified Sampling Methodology for Water Quality in Distribution Systems." ASCE J. Water Resour. Plann. Manage. 130(4), Jul. 2004, pp. 330-338.

\* cited by examiner

OPTIMIZING SENSOR PLACEMENT FOR STRUCTURAL HEALTH MONITORING

BACKGROUND

Technical Field

The present disclosure relates generally to structural health monitoring, and more specifically to techniques for optimizing sensor placement for structural health monitoring.

Background Information

Structural deterioration is inevitable for structures (e.g., bridges, dams, buildings, etc.) that are subjected to adverse operational and environmental conditions over long service lives. For example, in the year 2006, over 26% of the 600,905 bridges in the U.S. were rated as either structurally deficient or functionally obsolete. As a result of economic considerations, most of these aging structures are still in service. If existing deficiencies are not improved, for example, damage and cracks detected and repaired at an early stage, minor deficiencies may grow and lead to expensive repairs or, if unaddressed for too long, to catastrophic failures.

To try to address these issues, many structures are periodically inspected for structural deterioration. For example, in the case of bridges in the United States, biennial bridge inspection is mandated by the Federal Highway Administration (FHWA). Typically, such inspection is a manual process, performed primarily visually by skilled engineers. The visual inspections are often quite time-consuming and labor-intensive, and even if diligently performed, generally cannot detect small-size cracks or cracks hidden under paint. Visual inspections may miss many types of hidden deterioration, and seldom reveals the underlying causes of structural damage. Accordingly, they provide an inadequate and unreliable solution to the problem of detecting structural deterioration.

A number of automated structural health monitoring (SHM) systems have been developed, that have the potential to improve upon visual inspection. A typical SHM system includes a collection of sensors (e.g., accelerometers, strain gauges, corrosion sensors, etc.) placed on a structure, which are connected via cabling to one or more data acquisition units. The SHM system may constantly monitor the structure, and alert engineers if sensor readings indicate possible structural damage. Use of a SHM system may potentially allow engineers to move from current time-based maintenance programs to condition-based maintenance programs, which, in theory, could be more cost-effective.

Unfortunately, initial deployment of SHM systems may be quite expensive, reducing any potential overall cost savings. Such expense may be directly related to the number of sensors deployed. In addition to the cost of each sensor itself, additional costs are generally incurred for cabling back to data acquisition units, and for installation labor. Some deployed systems have used large numbers of sensors, in attempts to observe all potentially relevant behavior. Although SHM systems may provide valuable measurements of structural health, the expense involved in their initial deployment has prevented them from achieving widespread use.

It would be desirable to utilize only a limited number of sensors with a SHM system to monitor a large or complex structure. However, as the number of sensors is decreased, it becomes increasingly important that the sensors are optimally placed on the structure to maximize the value of the information they are able to collect. Various attempts have been made to develop effective techniques for determining optimal sensor locations. However, each of these attempts has suffered shortcomings.

Accordingly, there is a need for improved techniques for optimizing sensor placement for structural health monitoring.

SUMMARY

In one example embodiment, an analysis application is used to optimize sensor placement by implementing a two-part optimization solution procedure, involving generating a contribution database, and determining an optimized sensor location set using the contribution database. The optimized sensor location set may indicate locations that maximize coverage of dynamic integrity, which is quantified by as a ratio of detectable damage scenarios to all damage scenarios used by the analysis application.

More specifically, in the example embodiment the structure may be represented as a finite element (FE) model. A scenario generation module of the analysis application may utilize a Monte Carlo simulation algorithm to produce a large number of random damage scenarios (e.g., 1000+ random damage scenarios) that each involves structural damage (e.g., represented as a stiffness reduction) to one or more randomly selected elements of the FE model. A structural analysis and design library may analyze the damage scenarios to determine sensitivity at possible sensor locations (e.g., nodes of the FE model), with these results being represented in the contribution database. For a user selected number of sensors (e.g., $<=15$ sensors), an optimized sensor location set is determined. To determine the optimized sensor location set, an optimization module that utilizes a genetic algorithm may determine successive candidate sensor location sets. A sensor placement evaluation module may compute performance indicators (e.g., based on coverage of damage integrity) for each candidate sensor location set utilizing the contribution database. The performance indicators may be used as fitness values to evolve the sensor location sets, and search for the optimized sensor location set. Once an optimized sensor location set is found, a user interface (UI) module of the analysis application may display the optimized sensor location set to a user. Based on the display, actual sensors may be applied to the structure at the locations to configure a SHM system.

It should be understood that a variety of additional features and alternative embodiments may be implemented other than those discussed in this Summary. This Summary is intended simply as a brief introduction to the reader for the further description which follows, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
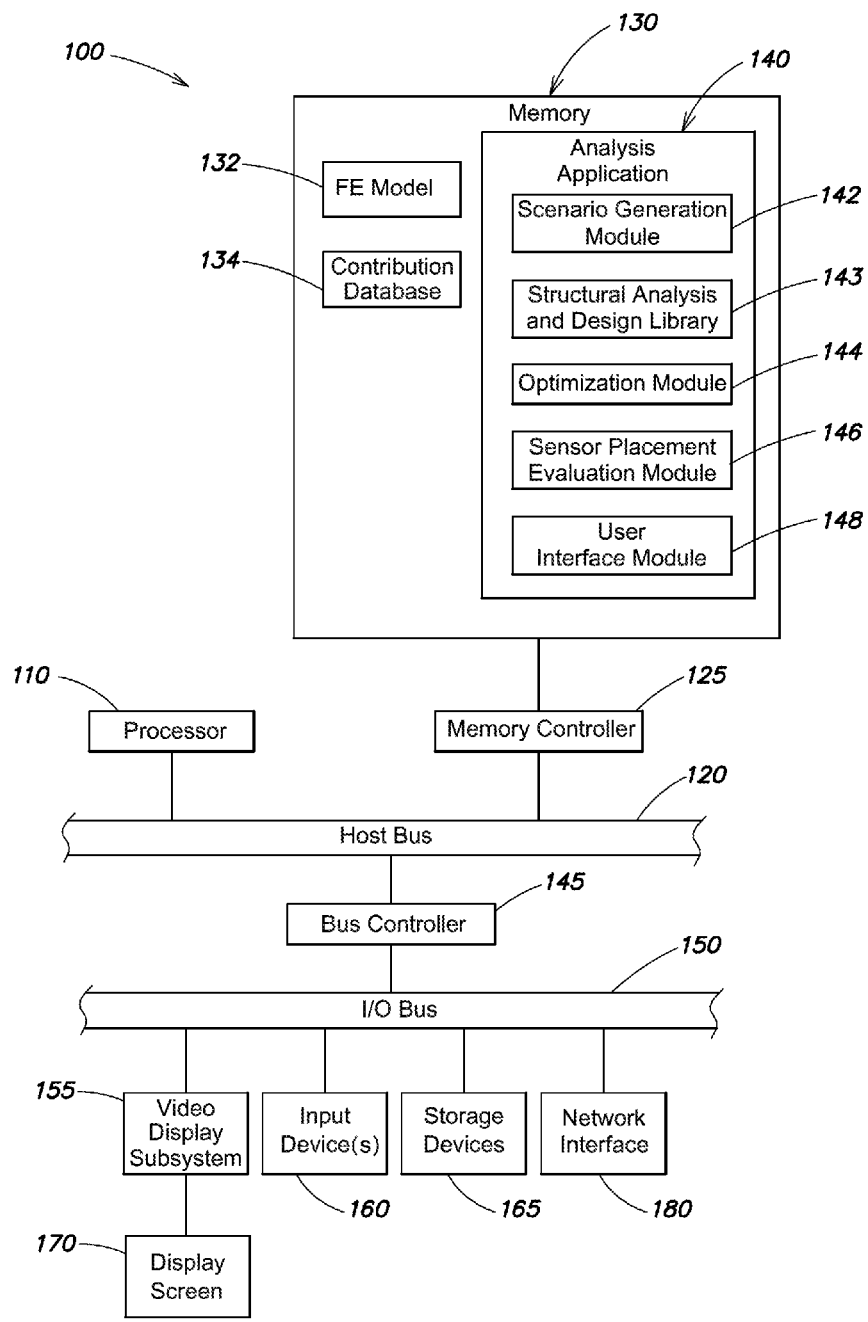
FIG. 1 is a block diagram of an example electronic device (e.g., a computer) that may be used with the present techniques.

FIG. 1 is a block diagram of an example electronic device 100 (e.g., a computer) that may be used with the present techniques. The electronic device 100 includes at least one processor 110 coupled to a host bus 120. The processor 110 may be any of a variety of commercially available processors, such as an Intel x86 processor, or another type of processor. A volatile memory 130, such as a Random Access Memory (RAM) is coupled to the processor is also coupled to the host bus via a memory controller 125. When in operation, the memory 130 stores processor-executable instructions and data that are provided to the processor. An input/output (I/O) bus 150 is accessible to the host bust 120 via a bus controller 145. A variety of additional components are coupled to the I/O bus 150. For example, a video display subsystem 155 is coupled to the I/O bus 150. The video display subsystem may include a display screen 170 and hardware to drive the display screen. At least one input device 160, such as a keyboard, a touch sensor, a touchpad, a mouse, etc., is also coupled to the I/O bus. A persistent storage device 165, such as a hard disk drive, a solid-state drive, or another type of persistent data store, is further attached, and may persistently store processor-executable instructions and data, that are loaded into the volatile memory 130 when needed. Still further, a network interface 180 is coupled to the I/O bus 150. The network interface enables communication over a computer network, such as the Internet, between the electronic device 100 and other devices, using any of a number of well-known networking protocols. Such communication may enable collaborative, distributed, or remote computing with functionality (including the functionality discussed below) spread across multiple electronic devices.

Working together, the components of the electronic device 100 (and other electronic devices in the case of collaborative, distributed, or remote computing) may execute a number of different software applications which utilize various types of data. For example, the memory 130 may store at least a portion of processor-executable instructions for an analysis application 140 that may be used to determine, for a user-provided number of sensors, optimized locations on a structure for their placement. The analysis application 140 may utilize data stored in the memory 130 such as a FE model 132 of a structure and a contribution database 134, in conjunction with a scenario generation module 142, a structural analysis and design library 143, an optimization module 144, a sensor placement evaluation module 146, and a UI module 148, among other software modules.

As discussed in more detail below, the FE model 132 may include a plurality of elements that intersect at nodes, constructed based on original design drawings of the structure or other information sources. The contribution database 134 may store a contribution matrix indicating sensitivity to damage in various damage scenarios. The scenario generation module 142 may utilize a Monte Carlo simulation algorithm to produce random damage scenarios that each involve structural damage to one or more randomly selected elements of the FE model 132. The structural analysis and design library 143 may include functions for performing simulation runs for the damage scenarios, to produce results that may be used to produce the contribution matrix 134. In one embodiment, the structural analysis and design library 143 is a finite element solver for structural analysis and design library, such as the OpenSTAAD library available from Bentley Systems Inc. of Exton Pa. The optimization module 144 may employ a genetic algorithm to determine candidate sensor location sets, and evolve those candidate sensor location sets based on fitness values, until an optimized sensor location set is determined. In one implementation, the optimization module 144 may be implemented as a generic optimization framework, such as the Darwin Optimization Framework available from Bentley Systems Inc. of Exton Pa. The sensor placement evaluation module 146 may compute performance indicators for sensor location sets using sensitivity information from the contribution database 134, and provide these back to the optimization module 144 for use as fitness values. The sensor placement evaluation module 146 may be an independent software module, or may be implemented as a portion of the optimization module 144. The UI module 148 may display a graphical UI on the display screen 170, in which a user may select parameters used to generate damage scenarios, select a number of sensors to be applied to the structure, and view optimized sensor location results, among other tasks.

The analysis application 140 and its modules 142-148 may operate to solve a mathematically defined sensor placement optimization problem. The sensor placement optimization problem may be formulated to consider, among other factors, frequencies of resonance and the deflected mode shapes. When solved, the sensor placement optimization problem may produce an optimized sensor location set that can maximize the coverage of all the resonances that dominate the response of the structure under normally occurring loads. In addition, it may take into account the possibility of local modes of vibration occurring.

Let $S=\{s1, s2, \ldots, s_{Nn}\}$ be the set of available sensor locations represented as nodes in the FE model 132 of the structure, where $N_n$ is the number of sensor locations. Possible damage scenarios may be represented by changing model parameters, for example, by changing material attributes. Due to the changed model parameters, the dynamic responses, in particular the mode shapes, are expected to change correspondingly. The changed dynamic responses can be quantified as sensitivity.

More specifically, in an N degree-of-freedom (DOF) structure system, a global stiffness matrix may be denoted as K and a global mass matrix may be denoted as M. Structural damage may be simulated as stiffness reduction, which may be expressed as a linear combination of each elemental stiffness matrix. Assuming the stiffness changes are small in a specific damage scenario denoted as m, the characteristic equation of the damaged structure can be expressed as:

$$[(K+\Delta K^m)-(\lambda_i+\Delta\lambda_i^m)M](\Phi_i+\Delta\Phi_i^m)=0$$

where $\lambda_i$ and $\Phi_i$ are $i^{th}$ eigenvalue and eigenvector of the undamaged, structure system, $\Delta\lambda_i^m$ and $\Delta\Phi_i^m$ are $i^{th}$ eigenvalue and mode shape change under structure damage of $\Delta K^m$, which evaluates the structural changes. In the system described by the equation, structural damping is ignored and no mass reduction is considered in the damaged structure.

If the mode shape change is further expressed as a linear combination of the mode shapes in the original structure system, $\Delta\Phi_i^m$ in the above equation may be expressed as:

$$\Delta\Phi_i^m = \sum_{k=1}^{L_m} \alpha_k^m \sum_{\substack{r=1 \\ r \neq i}}^{N} \frac{-\Phi_r^T K_k \Phi_i}{\lambda_r - \lambda_i} \Phi_r = F(K^m)\delta A$$

$$F(K^m) = \left( \sum_{\substack{r=1 \\ r \neq i}}^{N} \frac{-\Phi_r^T K_1 \Phi_i}{\lambda_r - \lambda_i} \Phi_r, \sum_{\substack{r=1 \\ r \neq i}}^{N} \frac{-\Phi_r^T K_2 \Phi_i}{\lambda_r - \lambda_i} \Phi_r \dots \sum_{\substack{r=1 \\ r \neq i}}^{N} \frac{-\Phi_r^T K_{Lm} \Phi_i}{\lambda_r - \lambda_i} \Phi_r \right)$$

$$\delta A = \{\alpha_1^m \ \alpha_2^m \ \dots \ \alpha_{Lm}^m\}^T$$

where $L_m$ is the total number of damaged elements in the damage scenario m, $F(K)$ is the $N \times L_m$ matrix of damage sensitivity coefficients of the $i^{th}$ mode shape changes with respect to the damage vector $\delta A$, and $K_i$ is the $i^{th}$ elemental stiffness matrix. If several modes are used, $\Delta\Phi_i^m$ may become a mode shape difference (MSD) matrix and $F(K^m)$ may become the combination of sensitivity matrices for the selected modes.

These equations represent theoretical mode shape differences without any noise consideration, however measured mode shapes are usually compromised by environmental noises. Assuming a stationary Gaussian white noises is considered in the measurement system, a Fisher information matrix $Q^m$ ($L_m \times L_m$) can be used to quantify the damage sensitivity from each DOF of the structure, such that:

$$Q^m = F(K^m)^T F(K^m)$$

Better estimates of damage coefficient may be possible if measurement noise is uncorrelated and has identical statistical properties from each sensor. For this reason, it may be preferred to use high precision sensors.

The Fisher information matrix contains the damage sensitivity information, but the contribution from each specific DOF has an influence function associated with it, which corresponds with the deflected mode shape for practical purposes. If only limited sensors are available in the measurement, it is desirable to quantify the contributions from all locations. The locations for sensors can be reduced if their contributions are small. The amount of information can be formulated as the rank of the following matrix $E^m$, and the contribution from each DOF may be referred to as the diagonal element of the matrix:

$$E^m = F(K^m)[F(K^m)^T F(K^m)]^{-1} F(K^m)^T$$

where $E^m$ is a $N \times N$ matrix. The diagonal terms of the matrix $E^m$ represent the fractional contribution of each DOF to the rank of $E^m$. Hence, if a DOF contributes little information to the rank of the matrix $E^m$, this degree-of-freedom is redundant and can be removed from a candidate sensor location set. The remaining DOF are the optimum locations. By this technique, the first K sensor locations with the most information for damage localization can be determined. Although these sensor locations have the most information, the joint information contributed by two selected sensors can be duplicated for the same damage scenarios, instead of being information from different damage scenarios. In order to achieve the largest damage scenario coverage information, the spatial correlation relationship between sensor locations can be considered to maximize the sensor coverage.

As described above, the elemental stiffness matrix may be used to simulate local damage to each element. It is generally not convenient to fetch an elemental stiffness matrix for a large structure, especially when different types of elements are involved. Accordingly, a pre-calculated contribution matrix (which is stored in a contribution database) may be utilized.

$F(K^m)$ referred to above is the damage sensitivity matrix of a damage scenario m. In addition to the direct calculation based on elemental stiffness, it can also be calculated through finite element simulation with damage scenario i, such that:

$$F(K^m) = \Delta\Phi^m|_{\delta A^m}$$

where $\Delta\Phi^m$ is the modal shape changes between the undamaged structure and the structure in damage scenario m, $\delta A^m$ represents m-th damage scenario, $F(K^m)$ is a $N \times N_m$ matrix and $N_m$ is the number of modes considered in the computation. For every damage scenario m, single or multiple members can be damaged with different stiffness reduction ratios. The matrix $E^m$ can be similarly formulated with modified $F(K^m)$. Contribution from each DOF may be represented by diagonal element of $E^m$ matrix. Similarly, the $E^m$ matrix for all other simulated damage scenarios can be calculated and contribution from each DOF may extracted.

A contribution matrix C for all damage scenarios can be formulated as follows. Assume that $N_n$ nodes, as noted in the sensor location set S, are available for sensor placement. The damage scenario m may be analyzed with the FE model 132 and the matrix $\underline{E}^m$ calculated using the equation above. The contribution of scenario m may be assessed by using the contribution impact factor $c_{m, j}$ taking the value of either 1 or 0, which indicates effective or ineffective coverage of the scenario m by placing the sensor at location or DOF j, given as:

$$c_{m,j} = \begin{cases} 1 & \text{if } E^m \geq c^T \\ 0 & \text{if } E^m < c^T \end{cases}$$

where $c_{m, j}$ is the contribution of damage scenario m at sensor location j, and $c^T$ is a contribution threshold used for evaluating the contribution. Alternatively, contribution of damage scenario to DOF j can also be evaluated as:

$$c_{m,j} = \begin{cases} 1 & \text{if } \Delta\phi_m^{max}(j) \geq \psi^T \\ 0 & \text{if } \Delta\phi_m^{max}(j) < \psi^T \end{cases}$$

where $\Delta\phi_m^{max}(j) = \max_{N_m}\{\Delta\phi_m(j)\}$ is the maximum mode shape change for all of the selected modes at j-th DOF under damage scenario m and $\psi^T$ is the specified threshold mode shape change. Generating and analyzing each of the M scenarios may result in contribution matrix C, given as:

$$C = [c_{m,j}]_{M \times N_n}$$

Figure 2:
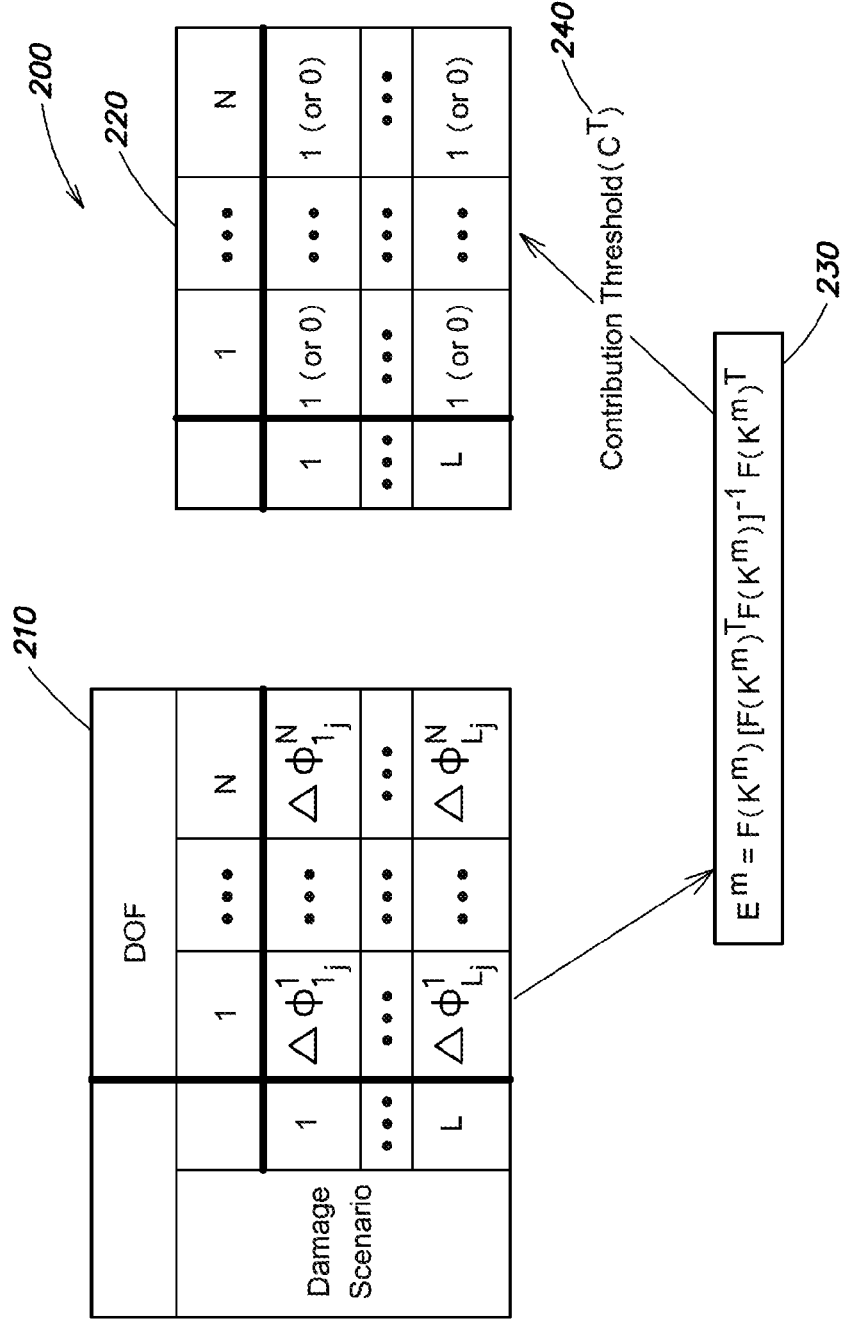
FIG. 2 is a diagram summarizing the operations used to produce a contribution matrix.

FIG. 2 is a diagram 200 summarizing the operations that may be used to produce a contribution matrix C 210. The contribution matrix C 210 may be produced from a MSD matrix 220 utilizing a matrix $E^m$ 230 and a contribution threshold $c^T$ 240. As can be seen, the contribution matrix C 210 serves as a sensitivity matrix, indicating for each damage scenario with a value of either 1 or 0, whether there is effective or ineffective coverage by placing a sensor at a particular location or DOF.

In order to optimize the placement of a limited number of sensors, optimization may be performed. Assume K ($K<<N_n$) sensors can be placed on the nodes chosen from the sensor location set S, each of the selected sensor locations is represented by using its index in the location set, the index of sensor $s_k$ is noted as $d_{s_k}$, $1 \leq d_{s_k} \leq N_n$, $k=1, \ldots, K$. The contribution of dynamic scenario m to sensor k is noted as $c_m, d_{s_k}$. The contribution of scenario m to all the K sensors is given as:

$$\Gamma_m = \left( c_{m,d_{s_1}} \vee c_{m,d_{s_2}} \vee c_{m,d_{s_3}} \vee \ldots \vee c_{m,d_{s_K}} \right)$$

This equation is a binary OR function, which results in a value of either 1 or 0 for scenario m. When taking the value of 1, it indicates that at least dynamic response change is recorded or covered by at least one sensor. Otherwise the equation returns zero. The equation may ensure that a damage scenario is only accounted for once among all the sensors to be placed. The overall performance of the selected K sensors may be evaluated by the ratio of the number of the covered scenarios to the total number of the scenarios, given as:

$$RC = \frac{\sum_{m=1}^{M} \Gamma_m}{M}$$

In order to optimize the sensor placement, it is desirable to search for a specified number of sensor locations, noted as K, so that the overall performance of the K sensors is maximized. Therefore, the sensor placement optimization may be formulated as:

Search for: $S_K = (s_1, s_2, s_3, \ldots, s_K) \in S$

Maximize $RC = \dfrac{\sum_{m=1}^{M} \Gamma_m}{M}$

The analysis application 140 may use its module 142-148 to solve this problem in two phases including (1) generation of the contribution matrix and (2) optimization of sensor placement using the contribution matrix.

Figure 3:
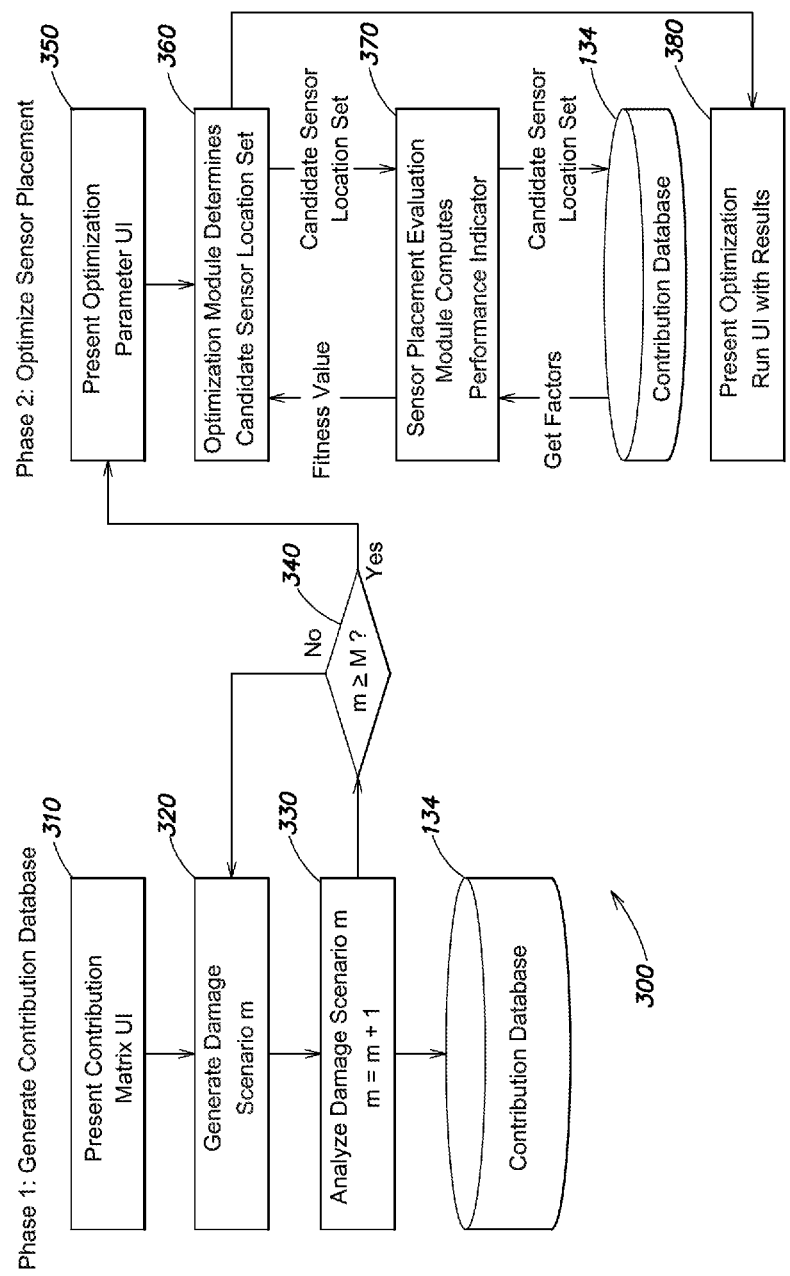
FIG. 3 is a flow diagram of a sequence of steps that may be implemented by an analysis application for optimizing sensor placement.
Figure 4A:
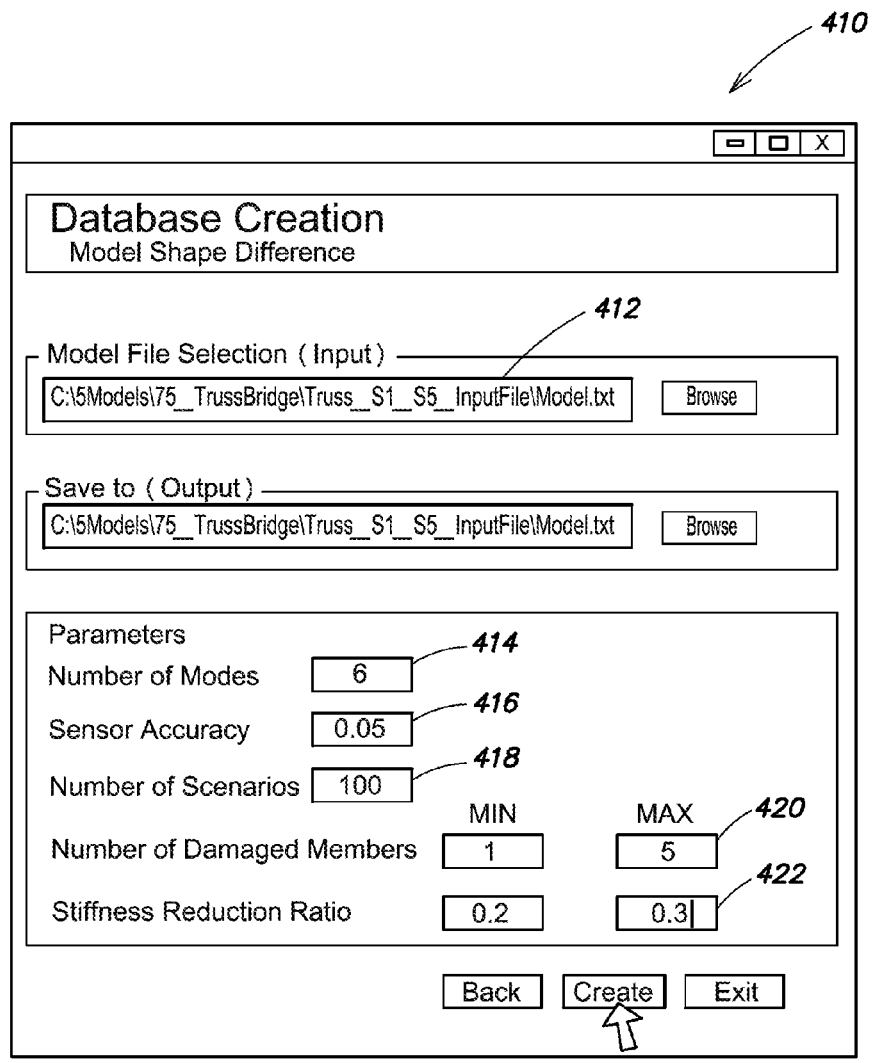
FIG. 4A is a screen shot of an example contribution database creation user interface.

FIG. 3 is a flow diagram of a sequence of steps 300 that may be implemented by the analysis application 140 for optimizing sensor placement. At step 310, the UI module 148 may present to a user a contribution database creation UI on the display screen 170. FIG. 4A is a screen shot of an example contribution database creation UI 410. It may include a field 412 for selecting a FE model 132 to use for the structure, and fields for entering parameters used to create the contribution database 134 (specifically, the contribution matrix stored therein), such as a number of modes 414, a sensor accuracy 416, a number of damage scenarios 418, a number of damaged elements/members 420, a stiffness reduction ratio 422, etc.

At step 320, using the selected FE model 132 and the parameters entered in the contribution database creation UI 410, the scenario generation module 142 may utilize a Monte Carlo simulation algorithm to generate a damage scenario m that involves structural damage to one or more randomly selected elements. At step 330, the structural analysis and design library 143 may be called to analyze the generated scenario m by conducting a model simulation run. Results of the simulation run, in particular mode shapes, may be used in the equations discussed above to produce a contribution matrix indicating sensitivity information, which is stored in the contribution database 134. The scenario m may be incremented and steps 320-320 repeated, until a number of damage scenarios M have been produced, as tested at step 340. In one implementation, the number of damage scenarios M may be large, for example, greater than or equal to 1000.

Figure 4B:
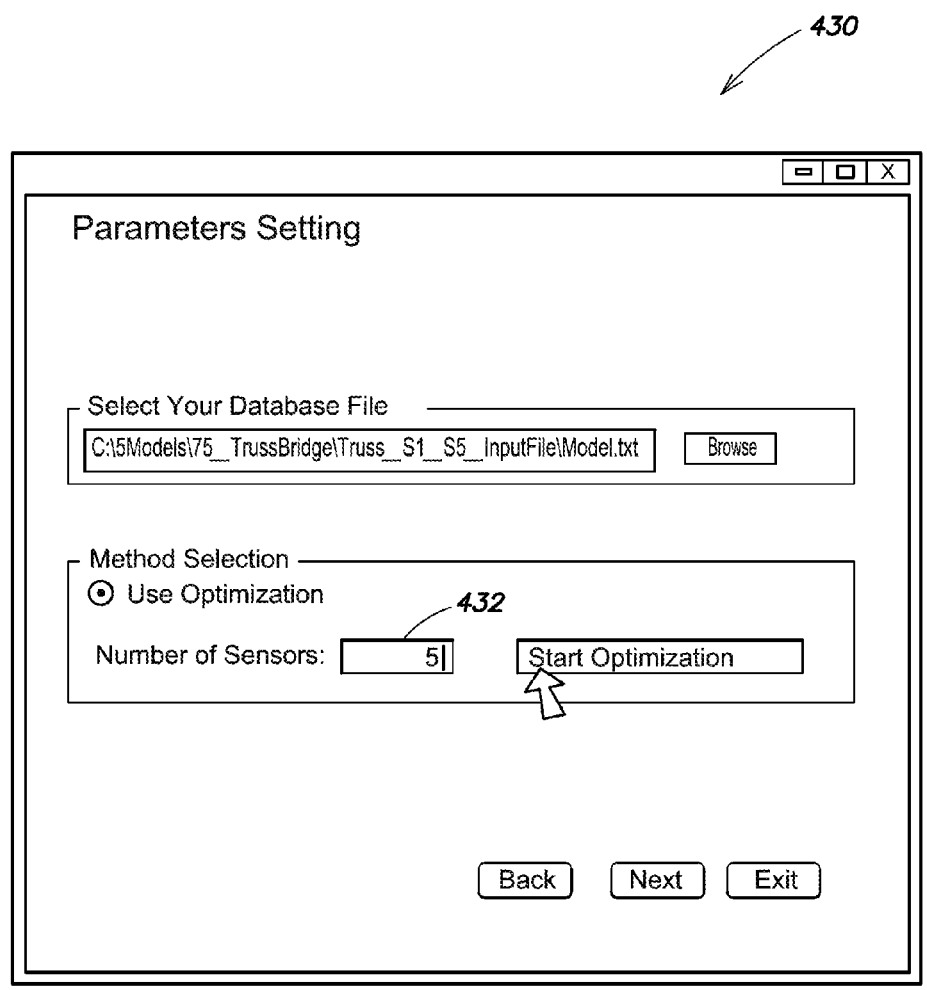
FIG. 4B is a screen shot of an example optimization parameter user interface.
Figure 4C:
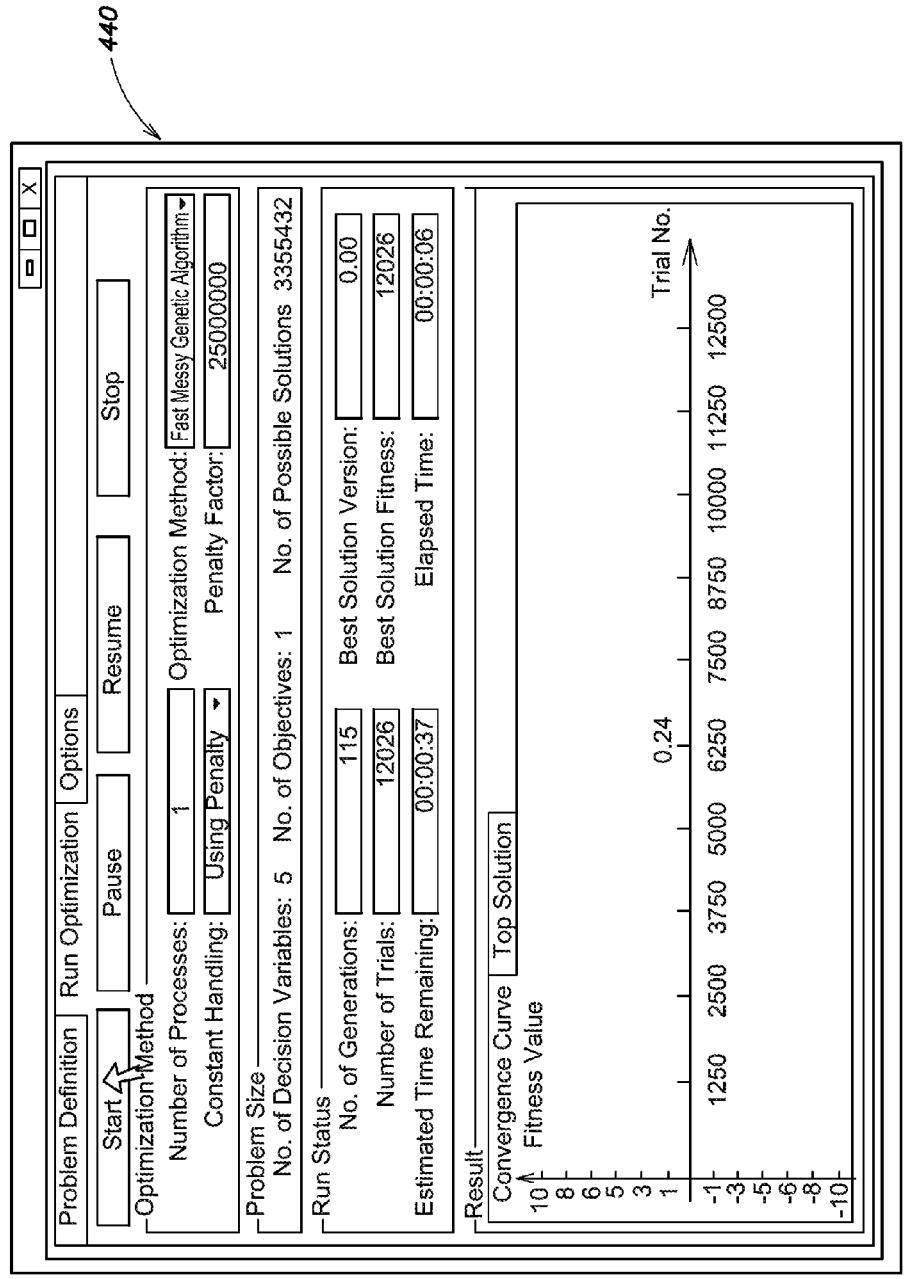
FIG. 4C is a screen shot of an example optimization run user interface.

Thereafter, at step 350, the UI module 148 may present an optimization parameter UI. FIG. 4B is a screen shot of an example optimization parameter UI 430. It may include a field 432 for selecting a number of sensors to be applied to the structure, among other fields. In one implementation, the number of sensor may be relatively small, for example, less than or equal to 15. At step 360, the optimization module 144 may determine a candidate sensor location set indicating possible locations for each of the number of sensors. The optimization module 144 may pass the sensor location set to the sensor placement module evaluation module 146. At step 370, the sensor placement module evaluation module 146 may compute a performance indicator for the sensor location set, as the ratio of the number of the covered scenarios to the total number of the scenarios, using the equations provided above. As part of the computation, the sensor placement evaluation module 146 may apply the sensor location set to the contribution database 134 (specifically to the contribution matrix represented therein). The performance indicator produced by the sensor placement evaluation module 146 may be provided back to the optimization module 144 as a fitness value. Using the fitness value, the optimization module 144 may produce (according to a genetic algorithm) a subsequent, potentially-improved candidate sensor location set, and the steps 360-370 repeated until an optimized sensor location set is eventually produced after many iterations. The optimized sensor location set may be provided to the UI module 148, which, at step 380, may display an optimization run UI. FIG. 4C is a screen shot of an example optimization run UI 440. Among other information, it may display results including locations of sensors indicated by the optimized sensor location set. Utilizing the results, an engineer may apply actual sensors at the locations on the structure to configure the SHM system.

In general, the analysis application 140 may be used with a wide variety of different types of structures, and with different numbers of sensors, to produce optimized sensor location sets. As the number of sensors increases, the dynamic coverage typically will also increase. Further, the optimized sensor location set for a smaller number of sensors will generally be a subset of the optimized sensor location set for a larger number of sensors. Such typical properties may be illustrated by example results of an example implementation.

Figure 5:
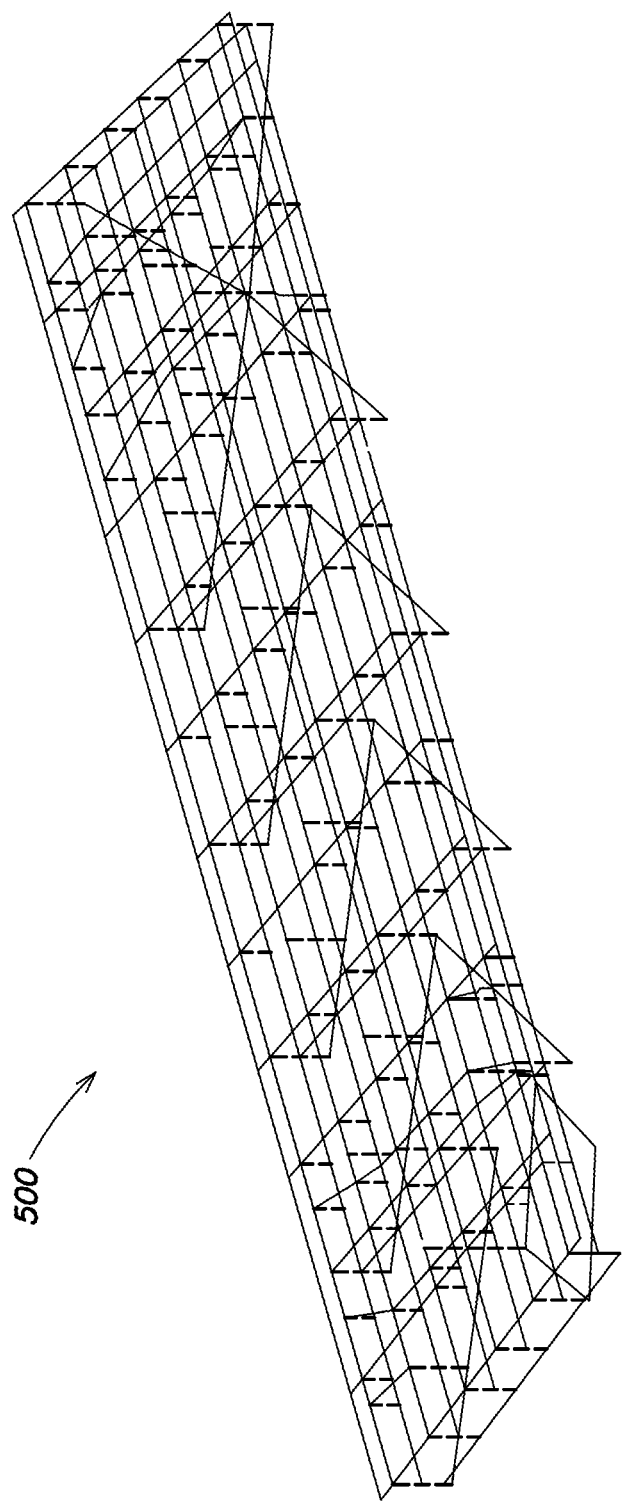
FIG. 5 is a representation of an example FE model of an example structure, specifically one approach span of the Verranzno Narrows Bridge Span in Brooklyn New York City.
Figure 6A:
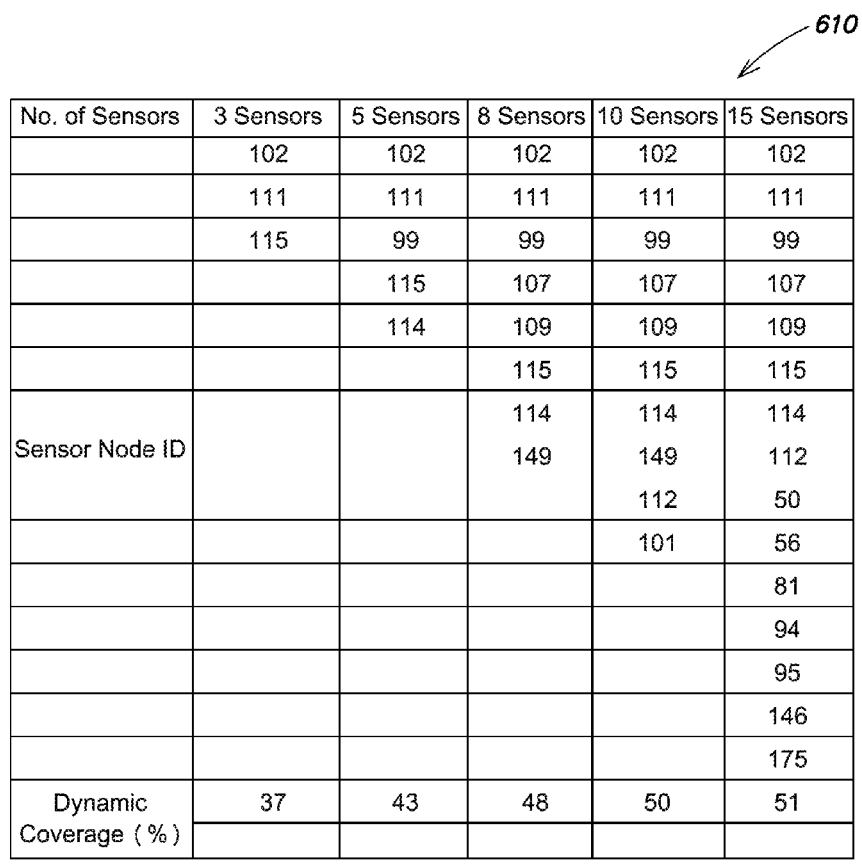
FIGS. 6A-6F are diagrams showing example optimized sensor location sets with sensor locations indicated by node identifier, in both tabular an graphical form.
Figure 6B:
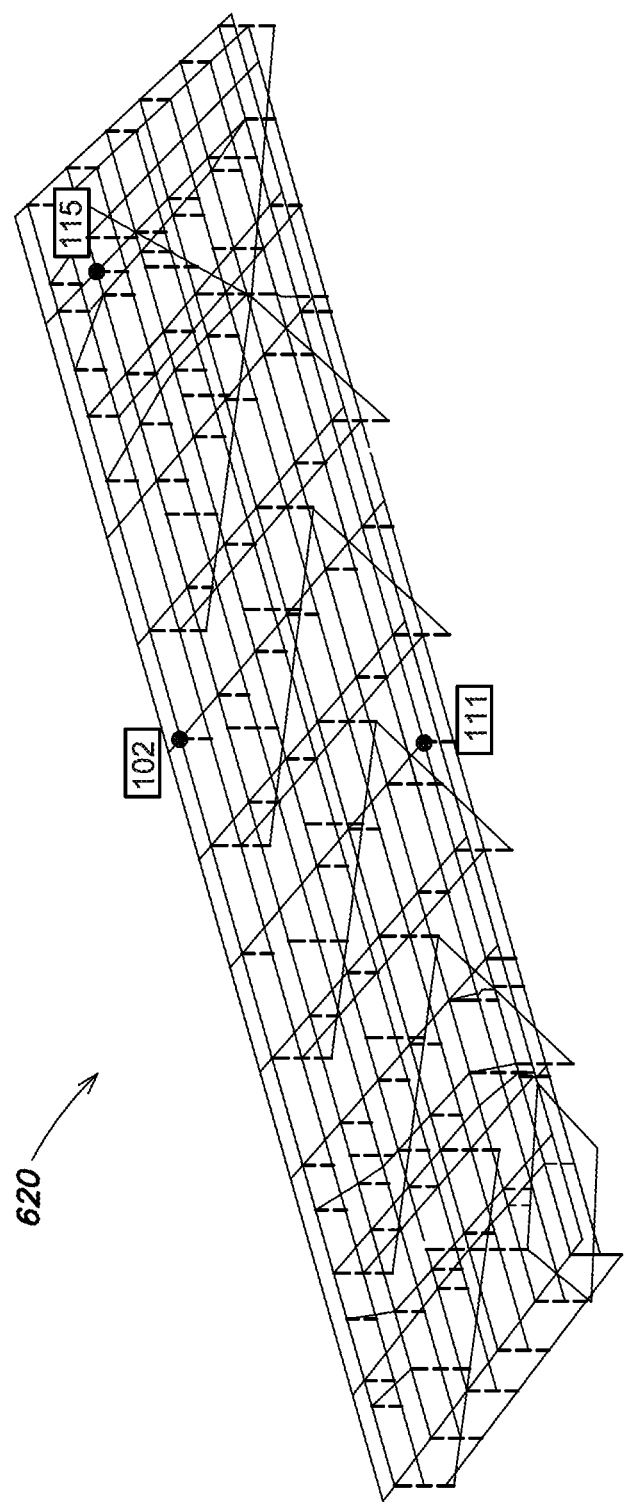
Figure 6C:
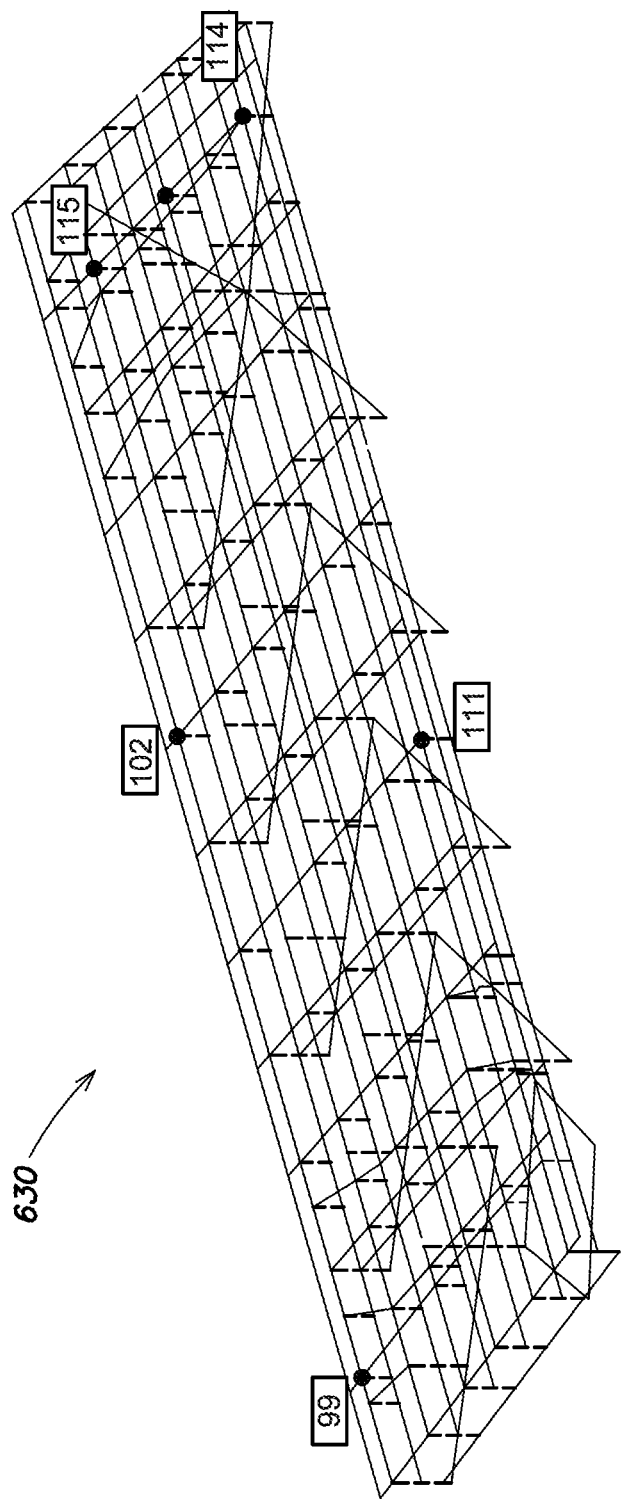
Figure 6D:
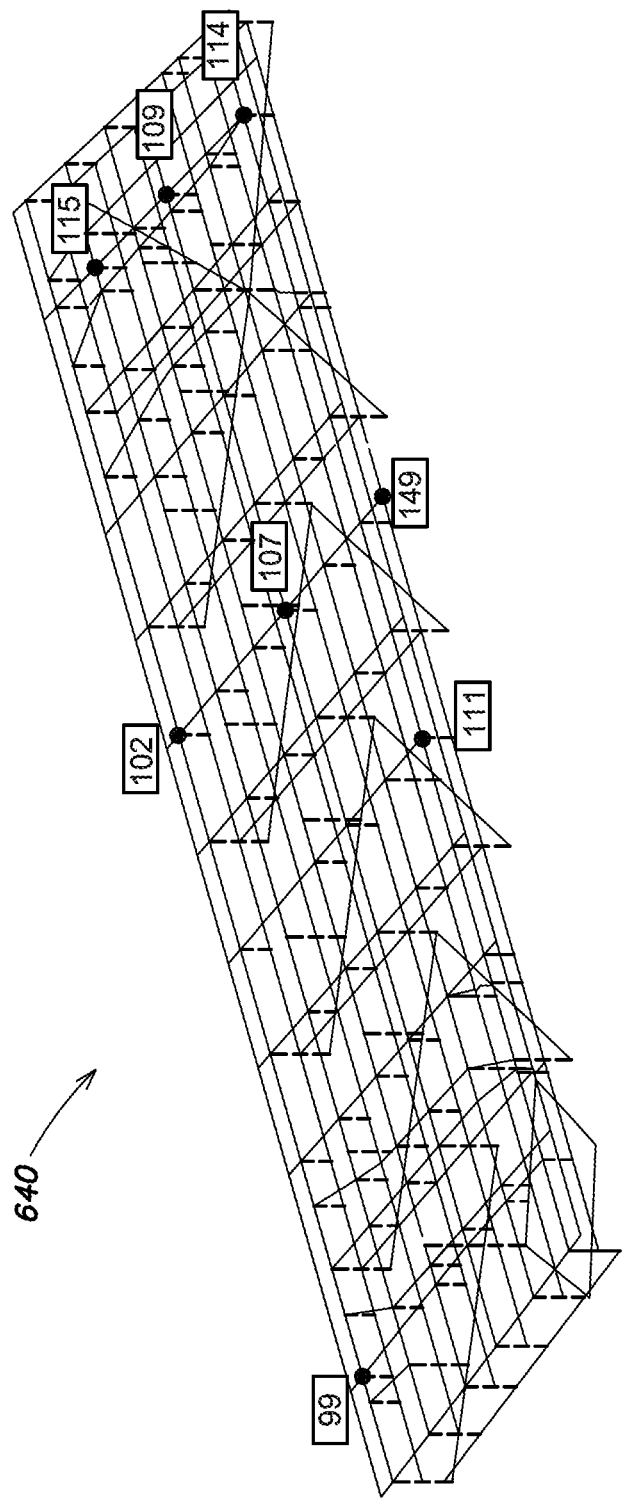
Figure 6E:
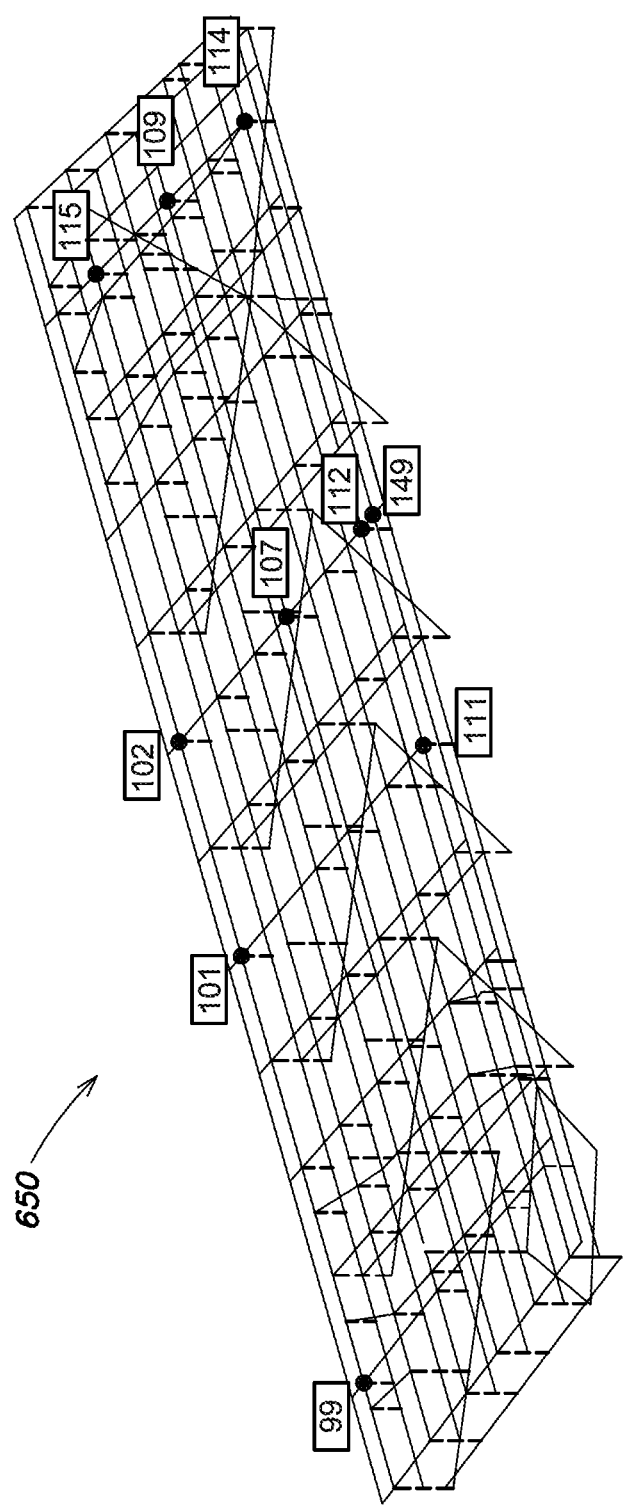
Figure 6F:
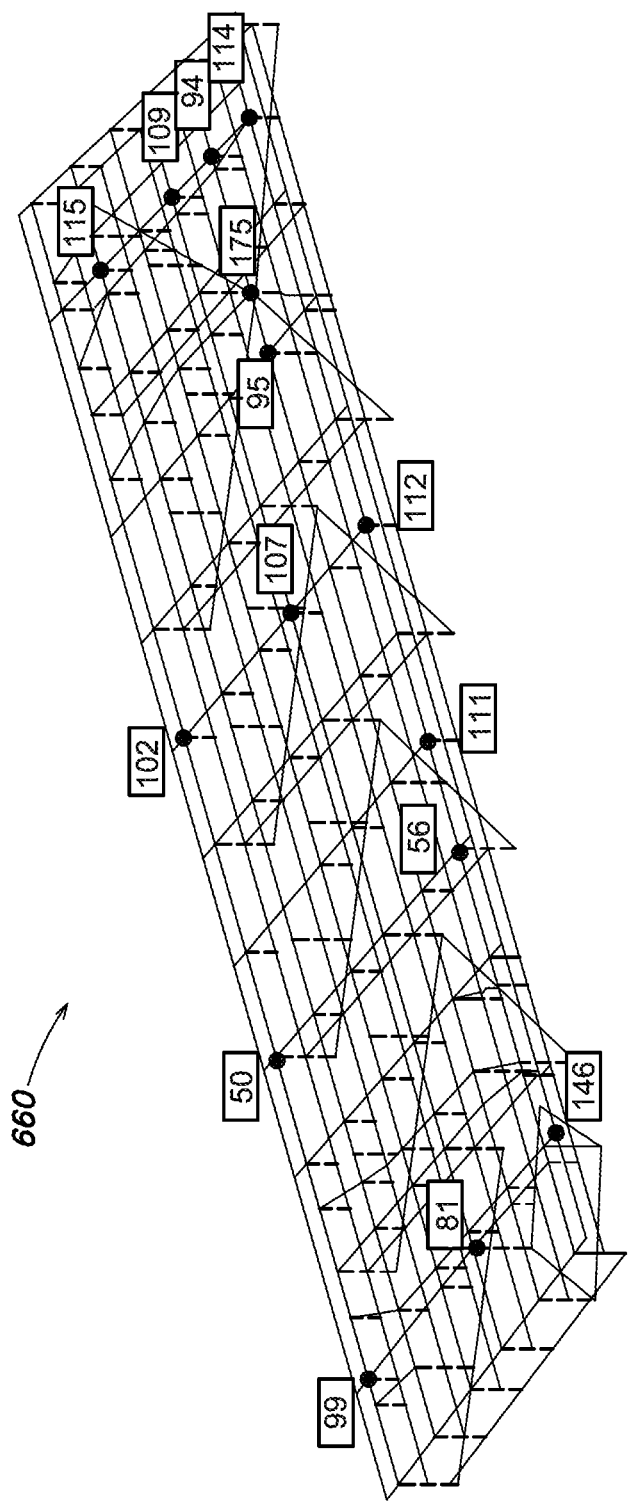

FIG. 5 is a representation of a FE model 500 of an example structure, specifically one approach span of the Verranzno Narrows Bridge Span in Brooklyn N.Y. City. Each node has a corresponding node identifier (ID). The example FE model 500 was created using the STAAD.Pro v8i structural analysis and design application available from Bentley Systems Inc. of Exton Pa. However, it should be understood that a variety of other structural analysis and design applications alternatively could have been utilized. Testing was conducted based on 1000 random damage scenarios with structural damage represented as about a 20% reduction in the original parameter values. Optimized sensor location sets were generated for differing numbers of sensors, including 3, 5, 8, 10 and 15 sensors. FIGS. 6A-6F are diagrams 610-660 showing example optimized sensor location sets with sensor locations indicated by node ID, in both tabular and graphical form. As can be seen by these example results, as the number of sensors increases, the dynamic coverage may increase, starting at 37% for 3 sensors and increasing to 51% for 15 sensors. Further, as can be seen by these example results, the optimized sensor location set for a smaller number of sensors may be a subset of the optimized sensor location set for a larger number of sensors, such that the 3-sensor location set is a subset of the 5-sensor location sets, which is a subset of the 8-sensor location set, and so forth.

In summary, the above description details techniques for optimizing sensor placement for structural health monitoring of a structure. It should be understood that various adaptations and modifications may be readily made to the techniques, to suit various implementations. Further, it should be understood that at least some of the techniques may be implemented in software, in hardware, or a combination thereof. A software implementation may include computer-executable instructions stored in a non-transitory computer-readable medium, such as a volatile or persistent memory, a hard-disk, a compact disk (CD), or other storage medium. A hardware implementation may include specially configured processors, logic circuits, application specific integrated circuits, and/or other types of hardware components. Further, a combined software/hardware implementation may include both computer-executable instructions stored in a non-transitory computer-readable medium, as well as one or more specially configured hardware components, for example, processors. Accordingly, it should be understood that the above descriptions are meant to be taken only by way of example.

What is claimed is:

1. A method of optimizing sensor placement for structural health monitoring of a structure, comprising:
representing the structure by a finite element (FE) model having a plurality of elements connected at nodes;
generating a contribution database that is stored on a non-transitory electronic device readable medium by:
generating a plurality of damage scenarios representing structural damage to the structure, using a Monte Carlo simulation algorithm which produces random damage scenarios, each random damage scenario involving structural damage to one or more randomly selected elements of the FE model, and
analyzing each damage scenario to determine sensitivity at possible sensor locations;
receiving a user's selection of a number of sensors to be applied to the structure;
optimizing placement of the number of sensors to produce an optimized sensor location set that maximizes coverage of dynamic integrity for the number of sensors, wherein dynamic integrity is measured as a ratio of detectable damage scenarios to the plurality of damage scenarios, by:
determining a candidate sensor location set by an optimization module that utilizes a genetic algorithm executing on an electronic device,
computing a performance indicator for the candidate sensor placement solution based on the contribution database, by a sensor placement evaluation module executing on the electronic device or another electronic device, wherein the performance indicator is computed as a ratio of a number of damage scenarios covered by the candidate sensor placement solution to a total number of the plurality of damage scenarios,
using, by the optimization module, the performance indicator as a fitness value for the candidate sensor location set to search for a subsequent sensor location set, and
repeating the determining, computing and using until the optimized sensor location set is produced; and
applying sensors at locations on the structure indicated by the optimized sensor location set.

2. The method of claim 1, wherein the possible sensor locations coincide with nodes of the FE model.

3. The method of claim 1, wherein the generating further comprises:
simulating each damage scenario by changing model parameters to indicate a stiffness reduction.

4. The method of claim 3, wherein the generating further comprises:
in response to the changed model parameters, determining a mode shape difference (MSD) matrix; and
from the mode shape difference matrix, determining a contribution matrix which is stored in the contribution database, the contribution matrix having a plurality of rows and columns which represent damage scenarios and degrees of freedom (DOFs).

5. The method of claim 1, wherein a number damage scenarios of the plurality of damage scenarios is greater than or equal to 1000.

6. The method of claim 1, wherein the number of sensors is less than or equal to 15.

7. The method of claim 1, wherein the sensors comprise accelerometers.

8. A system comprising:
an electronic device having
a display screen;
one or more processors configured to execute executable instructions; and
a memory configured to store a finite element (FE) model that represents a structure, the model having a plurality of elements connected at nodes which coincide with possible sensor locations, and a contribution database describing a plurality of random damage scenarios, each random damage scenario involving structural damage to one or more randomly selected elements of the FE model, and executable instructions for a plurality of software modules that are executable on the one or more processors, the plurality of software modules including:
a user interface module configured to receive a user's selection of a number of sensors to be applied to the structure, a scenario generation module that uses a Monte Carlo algorithm configured to generate the random damage scenarios, a user interface module configured to receive a user's selection of a number of sensors to be applied to the structure, a sensor placement evaluation module configured to compute performance indicators of candidate sensor location sets based on the contribution database, the performance indicators computed as a ratio of a number of damage scenarios covered by the candidate sensor placement solution to a total number of the random damage scenarios, and an optimization module that utilizes a genetic algorithm configured to maximize coverage of dynamic integrity for the number of sensors, wherein coverage of dynamic integrity is measured as a ratio of detectable damage scenarios to the plurality of damage scenarios, by determining candidate sensor location sets using the performance indicators as fitness values for the candidate sensor location sets and producing an optimized sensor location set; and a plurality of sensor applied at locations on the structure indicated by the optimized sensor location set that operate to monitor structural health of the structure.

9. The system of claim 8, wherein the scenario generation module is configured to simulate each damage scenario by changing model parameters to indicate a stiffness reduction.

10. The system of claim 9 wherein the scenario generation module is configured to, in response to the changed model parameters, determine a mode shape difference (MSD) matrix, and, from the mode shape difference matrix, determine a contribution matrix which is stored in the contribution database, the contribution matrix having a plurality of rows and columns which represent damage scenarios and degrees of freedom (DOFs).

11. The system of claim 8, wherein a number damage scenarios of the plurality of damage scenarios is greater than or equal to 1000, and the number of sensors is less than or equal to 15.

12. The system of claim 8, wherein the sensors comprise accelerometers.

13. A method of optimizing sensor placement for structural health monitoring of a structure, comprising:

accessing a finite element (FE) model of a structure;

producing a contribution database by generating a plurality of random damage scenarios representing structural damage to the structure, each random damage scenario involving structural damage to one or more randomly selected elements of the FE model, and analyzing each random damage scenario to determine sensitivity at possible sensor locations;

receiving a user's selection of a number of sensors to be applied to the structure;

optimizing placement of the number of sensors to produce an optimized sensor location set that maximize coverage of dynamic integrity for the number of sensors, wherein coverage of dynamic integrity is measured as a ratio of detectable damage scenarios to the plurality of damage scenarios, by determining with a genetic algorithm candidate sensor location sets of possible sensor locations that coincide with nodes of the FE model, computing performance indicators for the candidate sensor location sets based on the contribution database, the performance indicators computed as a ratio of a number of damage scenarios covered by the candidate sensor placement solution to a total number of the random damage scenarios, and using the performance indicators as fitness values to search for subsequent sensor location sets, until the optimized sensor location set is produced;

displaying locations for sensors indicated by the optimized sensor location set; and applying sensors at locations on the structure indicated by the optimized sensor location set.

14. A method of optimizing sensor placement for structural health monitoring of a structure, comprising:

generating, by an electronic device, a contribution database that is stored on a non-transitory electronic device readable medium by generating a plurality of scenarios, each scenario involving changing one or more model parameters of one or more selected elements of a model of the structure, and analyzing each scenario to determine sensitivity at possible sensor locations;

optimizing placement of a number of sensors on the structure at selected ones of the possible sensor locations maximizing coverage for the number of sensors, wherein coverage is measured as a ratio of detectable scenarios to the plurality of scenarios, the optimizing performed by the electronic device by determining with a genetic algorithm candidate sensor location sets, computing performance indicators for the candidate sensor location sets based on the contribution database, and using the performance indicators as fitness values to search for subsequent sensor location sets, until an optimized sensor location set is produced;

displaying locations for sensors indicated by the optimized sensor location set on a display screen; and applying sensors at locations on the structure indicated by the optimized sensor location set.

15. The method of claim 14, wherein the sensors are structural health monitoring sensors and the scenarios are damage scenarios.

16. The method of claim 14, wherein the model is a finite element (FE) model.

17. The method of claim 14, wherein the generating is performed using a Monte Carlo simulation algorithm that produces random scenarios, each random scenario involving changing one or more model parameters of one or more randomly selected elements of the model of the structure.

* * * * *

UNITED STATES PATENT AND TRADEMARK OFFICE
CERTIFICATE OF CORRECTION

PATENT NO. : 9,964,468 B1
APPLICATION NO. : 14/563668
DATED : May 8, 2018
INVENTOR(S) : Zheng Yi Wu et al.

Page 1 of 1

It is certified that error appears in the above-identified patent and that said Letters Patent is hereby corrected as shown below:

In the Specification

Column 5, Line 35 reads:
"noises. Assuming a stationary Gaussian white noises is"
Should read:
--noises. Assuming a stationary Gaussian white noise $\varepsilon$ is--

Signed and Sealed this
Seventeenth Day of September, 2019

Andrei Iancu
*Director of the United States Patent and Trademark Office*